(12) United States Patent
Park

(10) Patent No.: US 7,433,048 B2
(45) Date of Patent: Oct. 7, 2008

(54) INTERFEROMETER SYSTEMS FOR MEASURING DISPLACEMENT AND EXPOSURE SYSTEMS USING THE SAME

(75) Inventor: Dong-Woon Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 11/217,168

(22) Filed: Sep. 1, 2005

(65) Prior Publication Data

US 2006/0077396 A1 Apr. 13, 2006

(30) Foreign Application Priority Data

Oct. 7, 2004 (KR) .................. 10-2004-0080081

(51) Int. Cl.
*G01B 11/02* (2006.01)
*G01D 5/36* (2006.01)

(52) U.S. Cl. .............. 356/500; 356/499; 250/237 G

(58) Field of Classification Search ........... 356/488, 356/494, 499, 500, 521; 250/237 G
See application file for complete search history.

(56) References Cited

U.S. PATENT DOCUMENTS

| | | | | |
|---|---|---|---|---|
| 3,891,321 A | * | 6/1975 | Hock | 356/488 |
| 4,436,424 A | * | 3/1984 | Bunkenburg | 356/498 |
| 4,815,850 A | * | 3/1989 | Kanayama et al. | 356/488 |
| 5,404,220 A | * | 4/1995 | Takeuchi et al. | 356/488 |
| 5,838,450 A | * | 11/1998 | McCoy et al. | 356/401 |
| 6,282,011 B1 | | 8/2001 | Tearney et al. | |
| 6,295,132 B1 | | 9/2001 | Drabarek | |
| 6,583,873 B1 | * | 6/2003 | Goncharov et al. | 356/326 |
| 6,639,686 B1 | * | 10/2003 | Ohara | 356/616 |
| 2003/0053074 A1 | | 3/2003 | Hill | |
| 2004/0135980 A1 | | 7/2004 | Hill | |

FOREIGN PATENT DOCUMENTS

| | | |
|---|---|---|
| DE | 3715864 A1 | 11/1987 |
| DE | 196 15 616 A1 | 10/1997 |
| DE | 199 33 290 A1 | 3/2001 |
| DE | 10256278 A1 | 6/2004 |
| DE | 69820856 T2 | 12/2004 |
| EP | 0309281 B1 | 3/1995 |
| GB | 2 170 005 A | 7/1986 |
| JP | 04-179115 | 6/1992 |
| JP | 2000-039305 | 2/2000 |

(Continued)

OTHER PUBLICATIONS

Office Action (Translation), German Patent Application No. 102005047162.5-52, Jan. 26, 2007.

(Continued)

*Primary Examiner*—Patrick J Connolly
(74) *Attorney, Agent, or Firm*—Myers Bigel Sibley & Sajovec

(57) ABSTRACT

Interferometer systems for measuring displacement include a displacement interferometer. This interferometer includes a displacement converter responsive to a measuring beam of light. The displacement converter is configured to transform movement thereof in a direction orthogonal to the measuring beam of light into a change in path length between a reflective surface of the displacement converter and the measuring beam of light. The displacement converter may include a transmission grating and a displacement mirror or a reflecting grating.

46 Claims, 14 Drawing Sheets

FOREIGN PATENT DOCUMENTS

| | | |
|---|---|---|
| JP | 2000-349020 | 12/2000 |
| JP | 2001-307983 | 11/2001 |
| KR | 1020000031172 A | 6/2000 |
| KR | 1020000070669 A | 12/2002 |
| KR | 1020030039676 A | 5/2003 |

OTHER PUBLICATIONS

Search Report (Partial), German Patent Application No. 1030035, Sep. 21, 2006.

* cited by examiner

INTERFEROMETER SYSTEMS FOR MEASURING DISPLACEMENT AND EXPOSURE SYSTEMS USING THE SAME

REFERENCE TO PRIORITY APPLICATION

This application claims priority to Korean Patent Application No. 2004-80081, filed Oct. 7, 2004, the disclosure of which is hereby incorporated herein by reference.

BACKGROUND OF THE INVENTION

The present invention relates to an optical apparatus and in particular, to an interferometer system for measuring displacements and exposure systems using the same.

Since the use of the Michelson interferometer system at the Michelson-Moley's experiment in 1887 for finding the presence of ether, interferometers have been widely used in various technical fields requiring precise measurement. Interferometers have been broadly employed in the fields of fine industries including operating works of exposure, diamond turning, precision processing works, and so forth, because they are capable of measuring a target with the accuracy at the level of 1 nm. Especially, since the development of the laser in 1960, a laser interferometer using a laser as a light source thereof contributes to enhancing the accuracy of measurement over a variety of industrial fields. The interferometer is an optical device using the physical phenomenon of interference of light that is induced when an optical path length of a measuring beam passing through a target object is different from a fixed optical path length of a reference beam.

FIG. 1 is a systemic diagram showing a basic structure of a Michelson interferometer. As illustrated by FIG. 1, a beam of light emitted from a light source S is divided into a reference beam RB and a measuring beam MB by a beam splitter BS, each progressing toward a reference mirror M1 and a moving mirror M2. The reference and measuring beams, RB and MB, are reflected on the reference and moving mirrors, M1 and M2, respectively, and then all return to the beam splitter BS. Thereafter, the reference beam RB is partially incident on a detector D by way of the beam splitter BS, while the measuring beam MB is partially incident on the detector D after being reflected on the beam splitter BS. The reference and measuring beams, RB and MB, incident on the detector D are superimposed to each other to form an interference fringe.

As well known, such an interference effect may be summarized by Equation 1 as follows. In Equation 1, the parameters I, $I_1$, and $I_2$ denote intensities of the interference fringe, the reference beam RB, and the measuring beam MB, respectively, and the parameter δ denotes a phase difference between the reference beam RB and the measuring beam MB.

$$I = I_1 + I_2 + 2\sqrt{I_1 I_2} \cos \delta \quad (1)$$

The variation in the intensity of the interference fringe is induced by the phase difference δ. Therefore, if it determines the number of migrations of the interference fringe monitored at the detector D, a position of the moving mirror M2 may be obtained by Equation 2 as follows.

$$X = X_0 + N \frac{\lambda}{2} \quad (2)$$

In Equation 2, the parameters X, $X_0$, N, and λ represent a displacement of the moving mirror M2, an initial position of the moving mirror M2, the number of interference fringes, and a wavelength of the lightwave used, respectively.

FIG. 2 is a perspective diagram showing a typical X-Y stage system and a displacement interferometer for determining a position of the stage system. As illustrated in FIG. 2, the typical X-Y stage system 10 is constructed with including a fixed stage base 12, a lower stage 14 disposed on the stage base 12, and a higher stage 16 disposed on the lower stage 14. The lower stage 14 is movable along the x-direction to the stage base 12, while the higher stage 16 is movable along the y-direction to the stage base 12. Thus, the higher stage 16 is able to move in second dimensions along both the x- and y-directions to the stage base 12.

Around the X-Y stage system 10, an optical interference system is arranged to measure x- and y-positions, and yaw (left and right trembling), of the higher stage 16. The optical interference system includes a light source 50 emitting a laser beam of a predetermined wavelength, beam splitters 1~4 distributing the laser beam 55 emitted from the light source 50, and interferometers, 20, 30, and 36, each measuring x and y positions, and yaw, of the higher stage 16, by means of the laser beams 55 divided by the beam splitters 1~4. In addition to the peripheral of the X-Y stage system 10, a wavelength tracker 40 may be disposed to measure a refractive index of air on purpose to monitor environmental variations such as temperature and pressure.

The x-interferometer 20 is composed of an x-measuring mirror 21, an x-beam splitter 22, and an x-detector 23, while the y-interferometer 30 is composed of a y-measuring mirror 31, a y-beam splitter 32, and a y-detector 33. The yaw interferometer 36 is constructed of the y-measuring mirror 31, a yaw-beam splitter 34, and a yaw-detector 35. The x- and y-measuring mirrors, 21 and 31, are adhesive to sidewalls of the higher stage 16 in order to create optical path differences in accordance with positional variations of the higher stage 16, and are oriented in parallel with the x- and y-directions. Further, the x-, y-, and yaw-beam splitters, 22, 32, and 34, are each comprised of reference mirrors to form their own reference beams.

Other components of the optical interference system, besides the x- and y-measuring mirrors 21 and 31, are fixed to the stage base 12. Therefore, the higher stage 16 is able to move in second dimensions to the light source 50. Meanwhile, in order to measure a relative motion of the higher stage 16, the laser beam 55 incident on the x- and y-measuring mirrors 21 and 31 needs to be reflected thereon in a normal direction. For that purpose, the measuring mirrors 21 and 31 should be manufactured in a size capable of assuring such a normal reflection. If the x-measuring mirror 21 is too small, an x-measuring beam 55 would stray from the x-measuring mirror 21 by a y-directional motion of the higher stage 16. To prevent the deviation of the beam, it is required for the x-measuring mirror 21 to be designed with a size larger than the maximum displacement along the y-direction of the higher stage 16 to the x-beam splitter 22. The requirement for the size of the measuring mirror is also applicable to the y-measuring mirror 31.

It is quite general to fabricate a stage, which is used in the field of fine industries such as semiconductor manufacturing processing in particular, to be operable with a very high accuracy of motion. In accomplishing the highly accurate control facility, the measuring mirrors for determining displacements must be also designed and manufactured with very high uniformities. Specifically, an exposure system is required to be operable with the uniformity at the level of several nanometers because surface uniformities of the measuring mirrors directly affect distortions and overlays of patterns transcribed to wafers.

However, as aforementioned, although there is a need for manufacturing the measuring mirror (either the x-measuring mirror or the y-measuring mirror) in a size capable of preventing the deviation of a measuring beam, it is very difficult and incurs significant cost in manufacturing the measuring mirror with such high uniformity at the level of several nanometers. Moreover, since the surface uniformity of the measuring mirror may be reduced in accordance with gravity, temperature variation, and acceleration by motion, continuous maintenance is required for keeping the uniformity of the measuring mirrors on the same level. This high level of maintenance can result in significant maintenance expenses.

SUMMARY OF THE INVENTION

Embodiments of the invention include a displacement converter that transforms an X-directional displacement of a motion object into a path difference of a measuring beam progressing along a y-direction. The displacement interferometer includes a light source generating a light beam, a beam splitter dividing the light beam into a reference beam and a measuring beam, a reference mirror altering a progressing direction of the reference beam, a displacement converter altering a progressing direction of the measuring beam, and a detector sensing the direction-altered reference and measuring beams. The displacement converter transforms a displacement ($\Delta D$) perpendicular to the progressing direction of the measuring beam into a path difference ($\Delta P$) of the measuring beam. The displacement converter may be used with a transmission grating or a reflection grating.

In another embodiment of the invention, the displacement converter includes a transmission grating, and a displacement mirror disposed apart from the transmission grating, and facing the transmission grating with a predetermined slope angle ($\beta$). The transmission grating and the displacement mirror are disposed to establish a relation of $\Delta P = 2 \cdot \Delta D \cdot \sin \beta$ among the path difference ($\Delta P$), the slope angle ($\beta$), and the displacement ($\Delta D$). The transmission grating is preferably arranged perpendicular to the progressing direction of the measuring beam. In particular, the displacement mirror is preferably arranged to reflect a first diffracted beam of the measuring beam by way of the transmission grating. It is preferable that when a pitch of grating fringes in the transmission grating is d, an angle in which the progressing direction of the measuring beam is relative to a normal of the transmission grating is $\alpha$, and a wavelength of the light beam is $\lambda$, the slope angle $\beta$ of the displacement mirror is $\arcsin(\lambda/d - \sin \alpha)$, which defines a diffraction angle of the first diffracted beam of the measuring beam, against the normal of the transmission grating.

In still another embodiment, the displacement converter comprises a reflection grating disposed with a predetermined slope angle ($\beta$) to the progressing direction of the measuring beam. The reflection grating is disposed to establish a relation of $\Delta P = 2 \cdot \Delta D \cdot \tan \beta$ among the path difference ($\Delta P$), the slope angle ($\beta$), and the displacement ($\Delta D$).

A light beam returning to the beam splitter from the reflection grating is preferred to be the first diffracted beam. It is preferred that when a pitch of grating fringes in the reflection grating is d, and a wavelength of the light beam is $\lambda$, the slope angle $\beta$ of the reflection grating is $\arcsin(\lambda/d)$ against the progressing direction of the measuring beam.

Other embodiments are available to set relatively fixed positions among the beam splitter, the detector, the reference mirror, and the displacement converter. According to these embodiments, the beam splitter, the detector, the reference mirror, and the displacement converter are movable together with each other against the light source that is fixed. According to these embodiments, using a result sensed by the detector, a displacement of the displacement converter moving perpendicular to the progressing direction of the measuring beam may be independently determined.

Still other embodiments are available to set relatively fixed positions among the beam splitter, the reference mirror, and the displacement converter. According to these embodiments, the beam splitter, the reference mirror, and the displacement converter are movable together with each other against the light source that is fixed. According to these embodiments, using a result sensed by the detector, a displacement of the displacement converter moving perpendicular to the progressing direction of the measuring beam may be independently determined.

In still further embodiments of the invention, relative positions among the beam splitter, the detector, and the reference mirror are fixed, while the displacement converter may be variable in position relative to the beam splitter, the detector, and the reference mirror. According to these embodiments, a displacement sensed by the detector is a result of summing perpendicular and parallel displacements against the progressing direction of the measuring beam. In this embodiment, in determining the perpendicular displacement, the displacement parallel with the progressing direction of the measuring beam is independently measured.

Systems according to further embodiments of the present invention include a second displacement interferometer for measuring the parallel displacement in order to determine the displacement perpendicular to the progressing direction of the measuring beam. The systems may include a controller connected to the detector in order to determine the parallel and perpendicular displacements to the progressing direction of the measuring beam.

According to still further embodiments, the displacement interferometer employing the diffraction grating may be used to measure a z-directional displacement of an x-y stage. In this embodiment, it is required to have at least two displacement interferometers each employing a respective diffraction grating.

Moreover, a displacement interferometer system may include a displacement interferometer using one diffraction grating and two general displacement interferometers in order to determine x- and y-coordinates, and yaw, of the x-y stage. These displacement interferometer systems may be used for stage position measuring systems for exposure systems. For example, in a scan-type exposure system, the displacement interferometer system according to the embodiments of the invention may be utilized for measuring a position of a reticle stage.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout.

Figure 3A:
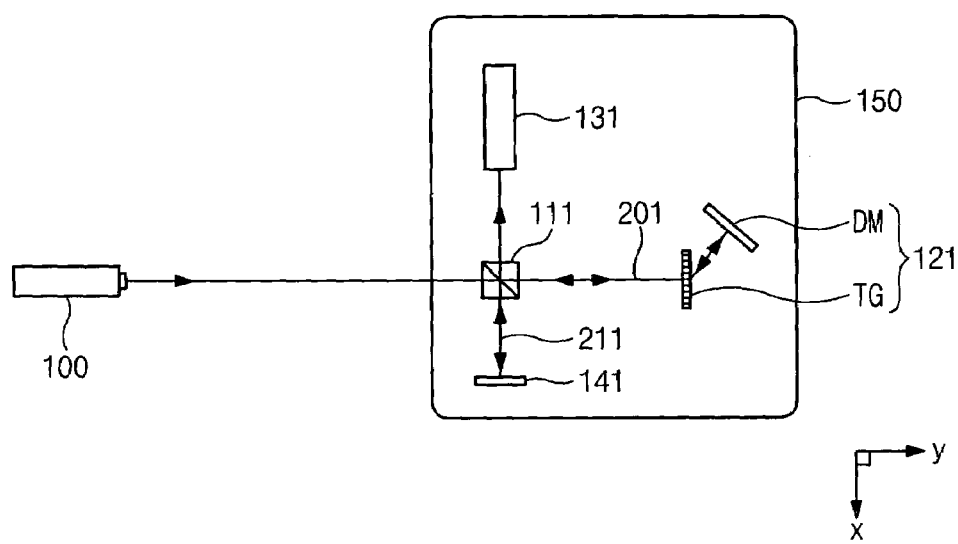
FIGS. 3A through 3C are schematic diagrams illustrating displacement interferometers employing a transmission grating in accordance with an embodiment of the present invention.
Figure 3B:
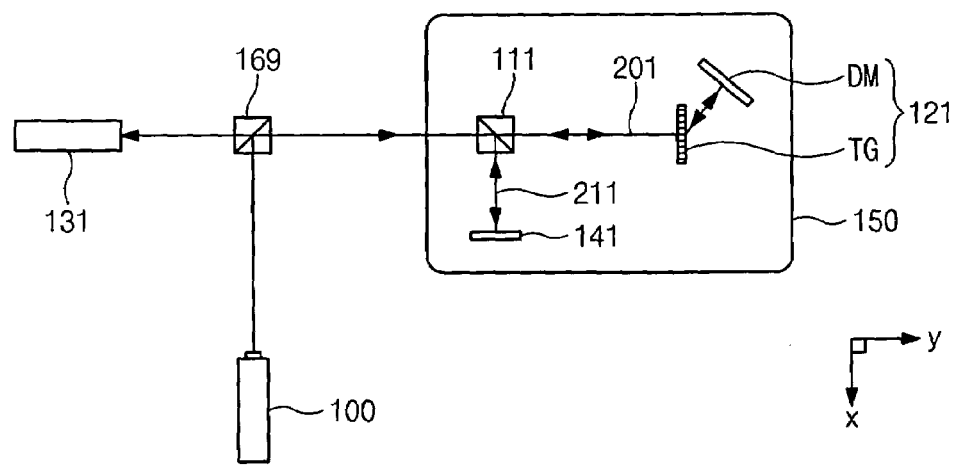
Figure 3C:
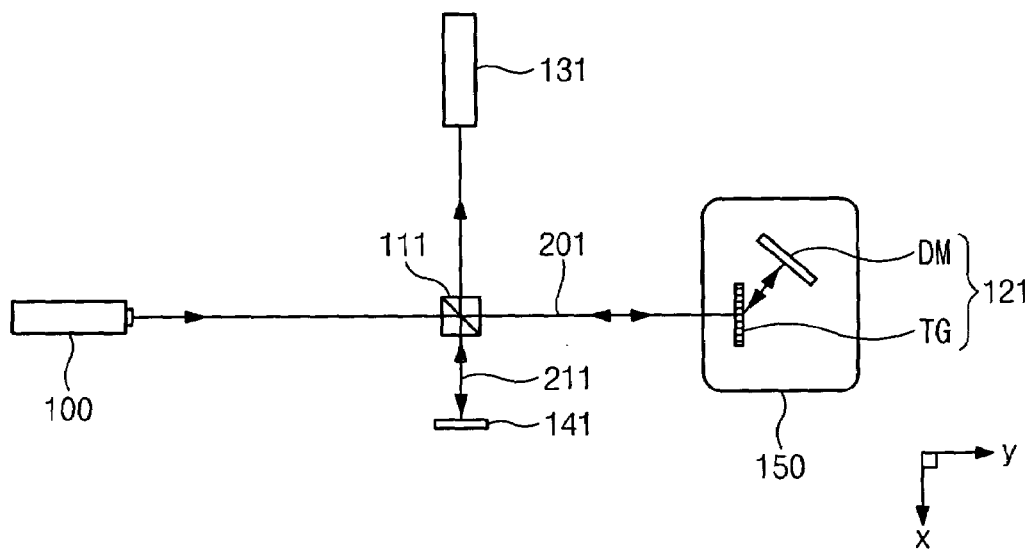

FIGS. 3A through 3C and FIGS. 4A through 4C are schematic diagrams illustrating configurations of displacement interferometers in accordance with embodiments of the present invention. In FIGS. 3A through 3C, the displacement interferometer is constructed to include a light source 100, a beam splitter 111, a reference mirror 141, a detector 131, and a displacement converter 121. The light source 100 generates a light beam of a predetermined wavelength, which is to be used during a procedure of measuring. The light beam may be generated by a mono-frequency laser, a dual-frequency laser, a multi-frequency laser, a Lamb laser, a Zeeman laser, or an inverted Lamb laser, or a spectral light beam. The light beam emitted from the light source 100 is divided into a reference beam 211 and a measuring beam 201 by the beam splitter 111. The beam splitter 111 may include a half-transparent mirror that partially reflects an incident beam thereon. The reference mirror 141 reflects the incident reference beam 211 thereon back towards the beam splitter 111. As illustrated, a direction of the reference beam 211 reflected by the reference mirror 141 may be opposite to that of the reference beam 211 incident on the reference mirror 141. To achieve this result, the reference mirror 141 may be a plane mirror, a corner tube, an angular reflector, or a retro-reflector, for example.

The displacement converter 121 reflects the incident reference beam 211 thereon back toward the beam splitter 111. The displacement converter 121 described herein is an optical device configured to convert a displacement ΔD, which is vertical to the progressing direction (i.e., the y-direction), into a path difference ΔP of the measuring beam 201. For this converting operation, the displacement converter 121 may include a diffraction grating. The diffraction grating is an assemblage of reflecting objects or transparent objects that are spaced apart from each other with a distance similar to the wavelength of the beam to be used. In particular, the diffraction grating may include transparent slit patterns formed in a transparent screen, or be an assemblage of reflecting grooves formed in a substrate. An electromagnetic wave incident on the diffraction grating is modified into a predetermined pattern in phase or amplitude due to the effect of diffraction. In some embodiments of the invention, the displacement converter 121 may be embodied as a transmission grating (TG) (refer to FIGS. 3A through 3C) or a reflection grating (RG) (refer to FIGS. 4A through 4C).

Figure 5A:
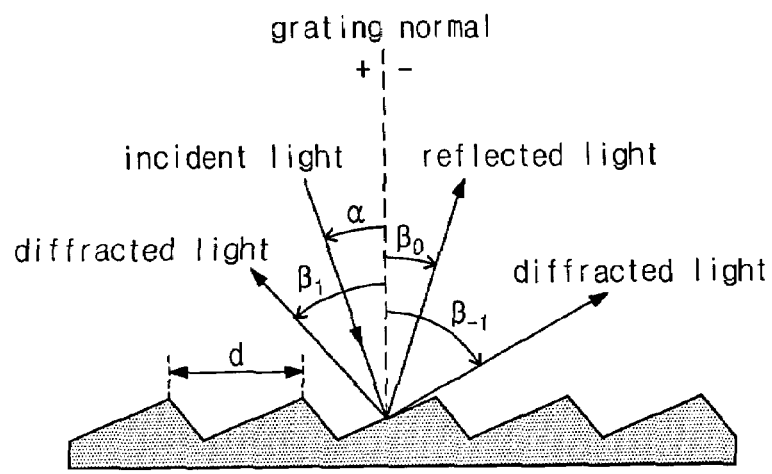
FIGS. 5A through 5C are schematic diagrams illustrating diffraction effects induced at diffraction gratings.
Figure 5B:
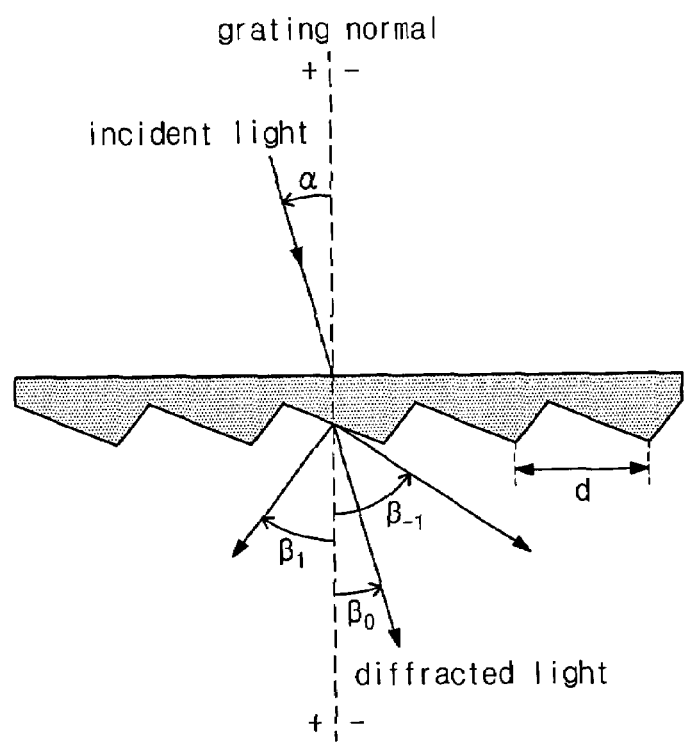
Figure 5C:
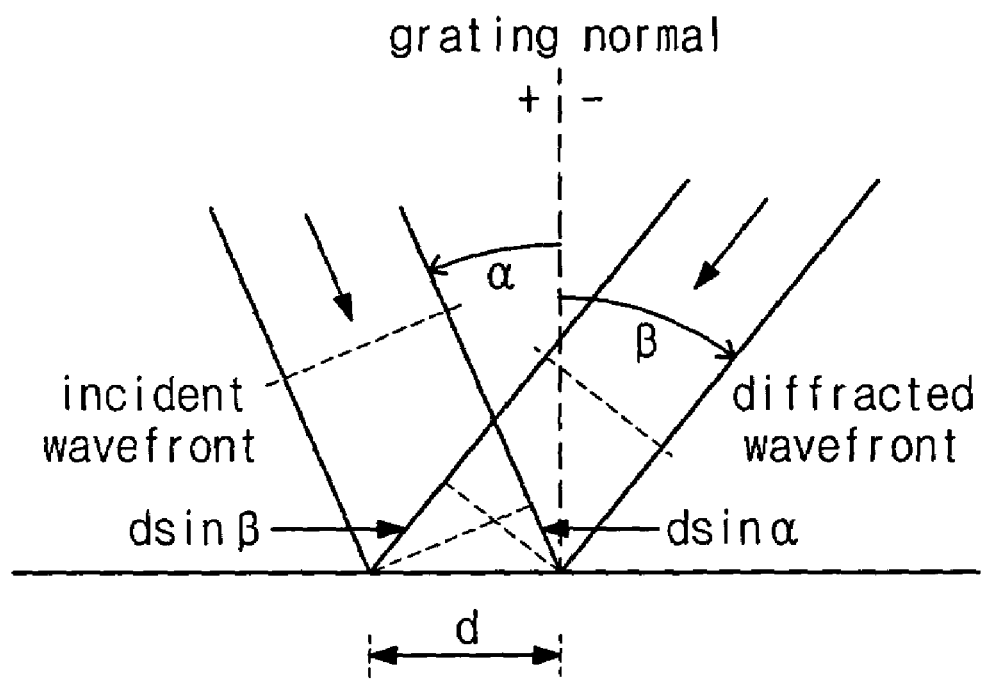

FIGS. 5A through 5C are schematic diagrams illustrating diffraction effects induced at diffraction gratings. FIGS. 5A and 5B show the features of diffraction caused when a predetermined light beam is incident on the reflection and transmission gratings, respectively. The reflection grating (RG) renders incident and diffracted light beams on the same side (see FIG. 5A), while the transmission grating (TG) renders incident and diffracted light beams on opposite sides of the grating (see FIG. 5B). FIG. 5C explains the diffraction effect in view of topology.

Referring to FIGS. 5A and 5B, a light beam of a wavelength λ is incident with an angle α to a grating having a pitch d, and then diffracted with an angle $\beta_m$. The incident angle α and the diffraction angle $\beta_m$ are obtained by arranging a grating normal (the broken line vertical to the grating surface at the center of the drawings). The pattern of sign convention for these angles is established by whether the diffracted light beam is located in the same side in comparison with the incident light beam. For instance, the incident and diffraction angles, α and $\beta_1$, are all positives, while the diffraction angles $\beta_0$ and $\beta_{-1}$ are all negatives.

As illustrated in FIG. 5C, a path difference between light beams passing through adjacent grooves in the grating is defined as d·sin α+d·sin β. According to the principle of optical interference, when such a path difference is equal to the wavelength λ or an integer times thereof, the light beams passing through the adjacent grooves have the same phase and thereby causes constructive interference. With all other diffraction angles β, offset interference may be generated. Under the condition of constructive interference, there is establishment of a grating equation among the incident angle α, the diffraction angle $\beta_m$, the pitch d, and the wavelength λ, as follows.

$$m\lambda = d(\sin \alpha + \sin \beta) \qquad (3)$$

In Equation 3, the parameter m is an integer representing a diffraction order or a spectral order. According to Equation 3, the diffraction angle $\beta_m$ corresponding to a predetermined diffraction order m may be obtained by Equation 4 as follows.

$$\beta_m(\lambda) = \arcsin(m\lambda/d - \sin \alpha) \qquad (4)$$

Returning to FIGS. 3A through 3C, the displacement converter 121 is composed of the transmission grating TG and the displacement mirror DM. It is preferable that the normal of the transmission grating TG is parallel with the progressing direction of the measuring beam 201 in order to make the measuring beam 201 incident perpendicularly on the transmission grating TG. In contrast, the displacement mirror DM is arranged at a predetermined angle to the transmission grating TG. Preferably, the displacement mirror DM is arranged to reflect a first diffracted beam received from the transmission grating TG back to the transmission grating TG. To achieve this reverse reflection, the normal to the displacement mirror DM faces should be parallel to the progressing direction of the first diffracted beam, being arranged with the angle $\beta_1$ defined by the following Equation 5 for the normal of the transmission grating TG.

$$\beta_1(\lambda)=\arcsin(\lambda/d) \quad (5)$$

Figure 6A:
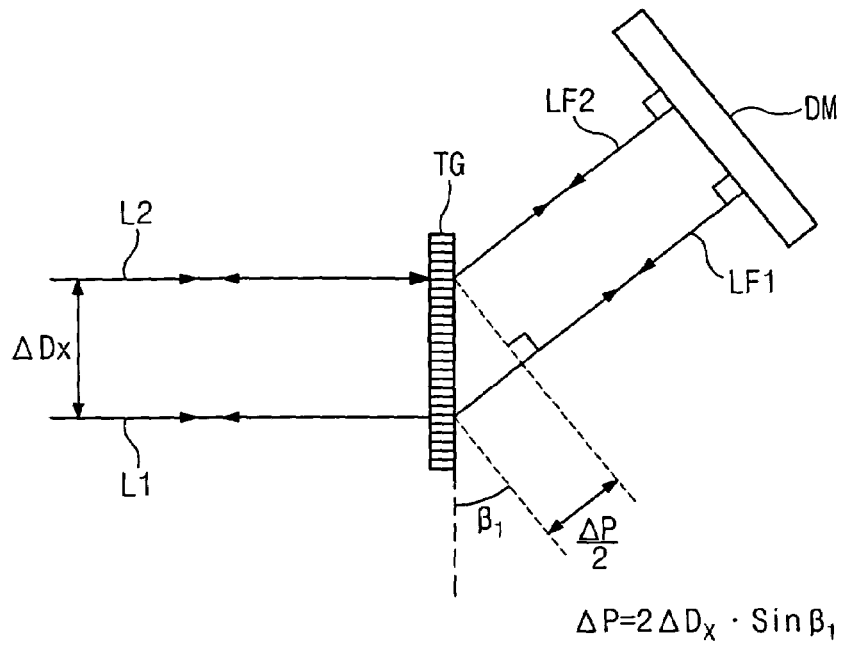
FIGS. 6A and 6B are schematic diagrams illustrating features of transforming a displacement into an optical path difference.
Figure 6B:
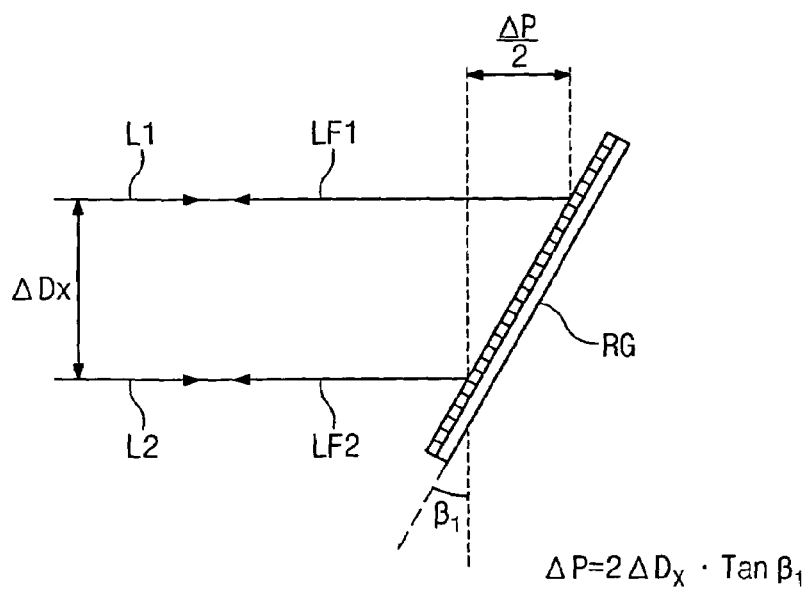

FIGS. 6A and 6B are schematic diagrams illustrating features of transforming the displacement ΔD into an optical path difference (OPD) by the displacement converter 121, which may include the transmission grating TG or the reflection grating RG. Referring to FIG. 6A, it is assumed that first and second measuring beams L1 and L2 are incident on the transmission grating TG in perpendicular with the same wavelength λ, being apart from each other by a distance ΔDx. The pitch between the grooves of the transmission grating TG is d. In this case, first diffracted beams LF1 and LF2 respectively of the first and second measuring beams progress with the diffraction angle $\beta_1$, which is determined by Equation 5, to the normal of the transmission grating TG.

As illustrated, when the displacement mirror DM is disposed at an angle relative to the transmission grating TG, there is a difference in path lengths of the first diffracted beams LF1 and LF2 of the first and second measuring beams, which have progressed to the displacement mirror DM. As illustrated, if the displacement mirror DM is arranged perpendicular to the progressing direction of the first diffracted beams LF1 and LF2, then Equation 6 specifies the optical path difference generated when the first diffracted beams LF1 and LF2 traffic between the transmission grating TG and the displacement mirror DM.

$$\Delta P=2\cdot\Delta Dx\cdot\sin\beta_1 \quad (6)$$

Using Equation 5, Equation 6 may be rewritten as:

$$\Delta P=2\cdot\Delta Dx\lambda/d \quad (7)$$

Referring to FIG. 6B, the reflection grating RG having grooves with the pitch d may be used as the displacement converter 121. In this case, if the reflection grating RG is arranged with the angle $\beta_1$, as described in Equation 5, against the progressing direction of the first and second measuring beams L1 and L2, which are spaced by the distance ΔDx, then the first diffracted beams LF1 and LF2 emitted from the reflection grating RG progress in the opposite direction to the measuring beams L1 and L2. Equation 7 specifies the optical path difference ΔP, which is also referred to herein as OPD.

Accordingly, the displacement converter of FIGS. 6A-6B receives a measuring beam of light and is configured to transform movement of the displacement converter in a direction orthogonal to the measuring beam of light into a change in path length between a reflective surface of the displacement converter and the measuring beam of light. As illustrated by FIG. 6A, the displacement converter includes a transmission grating (TG) having a front surface disposed in a path of the measuring beam of light; and a displacement mirror (DM) facing a rear surface of the transmission grating. The displacement mirror faces the rear surface of the transmission grating at an angle β and the change in path length is ΔP. The movement ΔD of the displacement converter in the direction orthogonal to the measuring beam of light is related to the change in path length ΔP by the following relationship: ΔP=2ΔD sin β. In FIG. 6B, the displacement converter includes a reflection grating (RG) and a primary surface of the reflection grating faces the measuring beam of light at an angle β relative to a normal to the primary surface. In this embodiment, the movement ΔD of the displacement converter in the direction orthogonal to the measuring beam of light is related to the change in path length ΔP by the following relationship: ΔP=2ΔD tan β.

Returning to FIGS. 3A through 3C, the reference beam 211 and the measuring beam 201, which are each reflected on the reference mirror 141 and the displacement converter 121, are incident on the detector 131 through the beam splitter 111. The detector 131 senses an interference fringe shaped by the overlay of the reference beam 211 and the measuring beam 201. During this, the interference fringe to be sensed is variable dependent upon the optical path difference (OPD) defined by Equations 6 and 7.

According to the embodiment shown in FIG. 3A, the beam splitter 111, the reference mirror 141, the displacement converter 121, and the detector 131 are fixedly installed at a motion object 150. Thus, even when the motion object 150 moves to change its location, there is no change in the distance between the beam splitter 111 and the reference mirror 141, or the distance between the beam splitter 111 and the displacement converter 121. As a result, when the motion object 150 is moving along the progressing direction (i.e., the y-direction) of the measuring beam 201, the phases of the measuring beam 201 and the reference beam 211 are maintained the same. On the other hand, when the motion object 150 moves perpendicular to the progressing direction of the measuring beam 201, i.e., along the x-direction, the path length of the measuring beam 201 reflected on the displacement converter 121 is changed. As a result, a phase difference between the measuring beam 201 and the reference beam 211 changes in correspondence with the variation of the path length, ΔP, of the measuring beam 201. Such variation of the phase difference is found as a change of the interference fringe sensed by the detector 131. The change of the interference fringe in accordance with the variation of the path length may be described by Equation 1.

According to the embodiment of FIG. 3B, the detector 131 may be arranged with a fixed position to the light source 100, and not mounted on the motion object 150. For this embodiment, it is preferred that the detector 131 be disposed on the extension lead through the displacement converter 121 and the beam splitter 111 so that the detector 131 receives the measuring beam 201 and the reference beam 211. As illustrated by FIG. 3B, an additional beam splitter 169 may be disposed to divide the light beam emitted from the light source 100 and the light beam progressing toward the detector 131.

According to the embodiment illustrated in FIG. 3C, the beam splitter 111, the reference mirror 141, and the detector 131 are arranged at positions, which are fixed relative to the light source 100, while the displacement converter 121 moves with being fixed to the motion object 150. Thus, a distance between the beam splitter 111 and the reference mirror 141 does not vary in response to any other movement of the motion object 150.

However, a progressing path length of the measuring beam 201 is variable in accordance with the movement of the motion object 150. In other words, if the motion object 150 is moving along the progressing direction (i.e., the y-direction) of the measuring beam 201, a distance between the beam splitter 111 and the displacement converter 121 is changed. Moreover, if the motion object 150 is moving perpendicular to the progressing direction of the measuring beam 201, (i.e., along the x-direction), the path length of the measuring beam 201 to the displacement mirror DM is also changed.

Accordingly, the variation of the interference fringe sensed by the detector 131 is influenced by a y-positional change as well as an x-positional change of the motion object 150. Therefore, in order to know a practical displacement along the x-direction, the y-directional displacement must be subtracted from the total displacement obtained from the variation of the measured interference fringe.

Figure 4A:
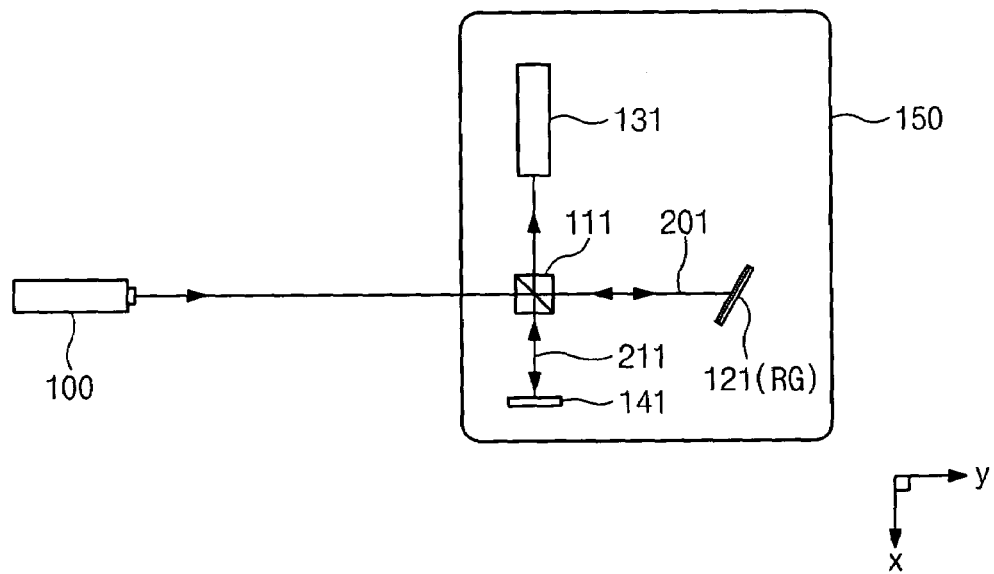
FIGS. 4A through 4C are schematic diagrams illustrating displacement interferometers employing a reflection grating in accordance with another embodiment of the present invention.
Figure 4B:
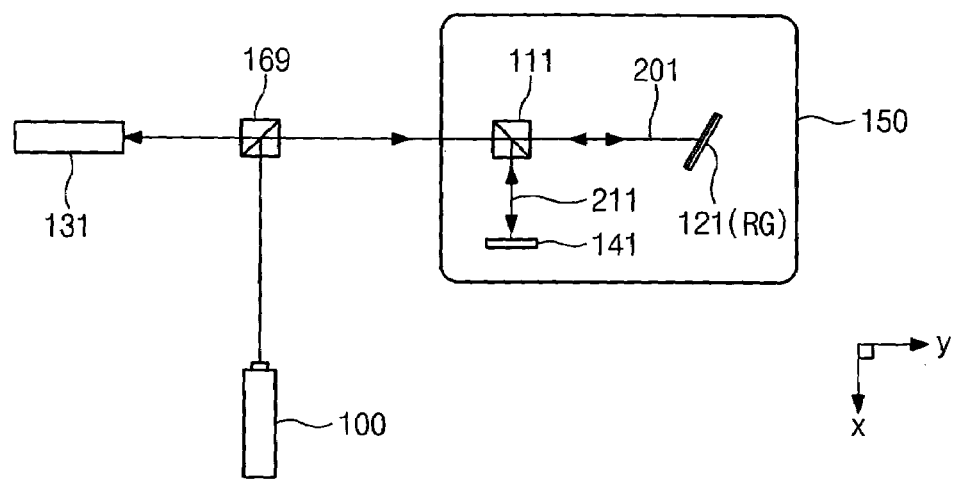
Figure 4C:
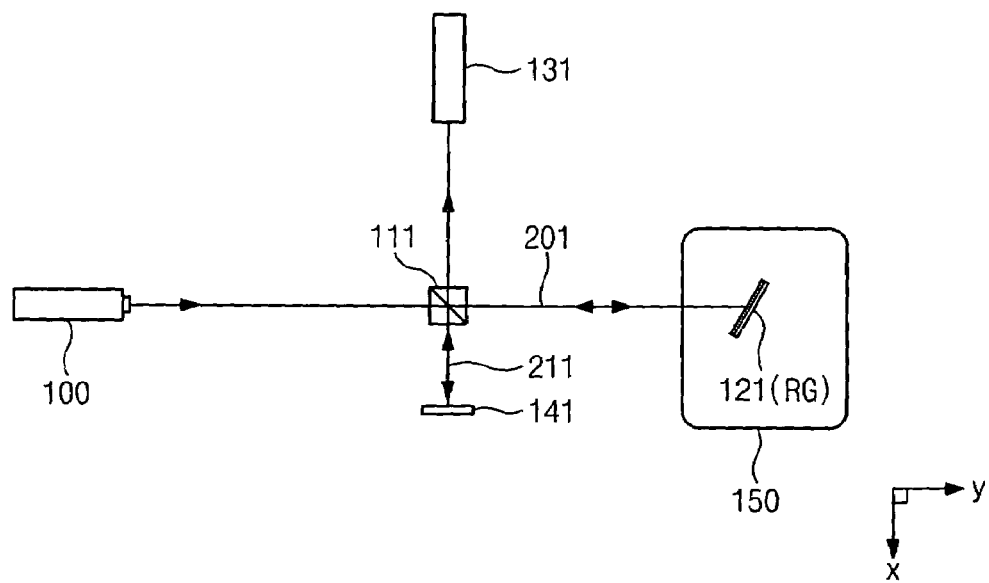

FIGS. 4A through 4C illustrate alternative embodiments of the invention that use a reflection grating RG as the displacement converter 121, instead of the transmission grating TG shown in FIGS. 3A through 3C. The reflection grating RG is preferably arranged to form the angle $\beta_1$, which is defined by Equation 5, against the progressing direction of the measuring beam 201. Thus, if an x-directional position of the motion object 150 varies by $\Delta Dx$ relative to the measuring beam 201, the optical path difference (OPD) is described by Equations 6 and 7. Such a path length difference is found as the variation of the interference fringe by the detector 131.

Figure 7:
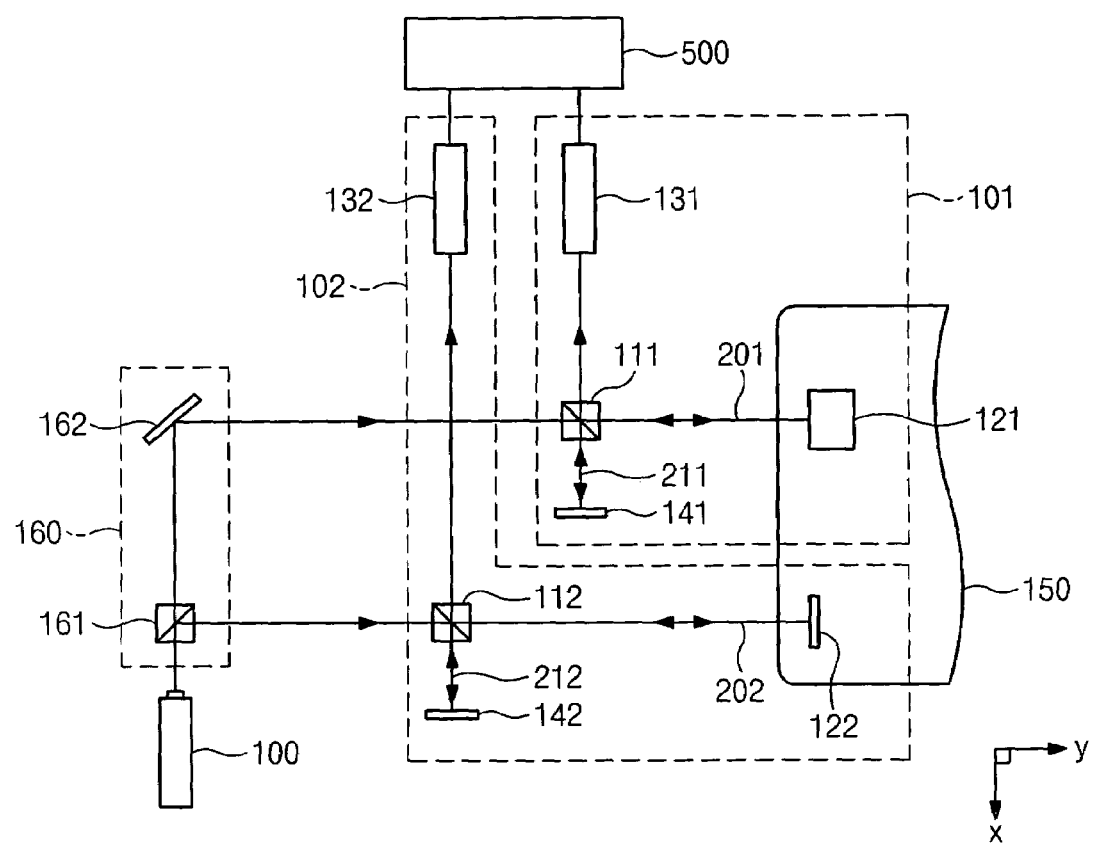
FIGS. 7 through 9 are schematic diagrams illustrating various configurations of displacement interferometer systems in accordance with embodiments of the present invention.

FIG. 7 illustrates a displacement interferometer system that can determine a practical displacement along the x-direction. Referring to FIG. 7, the displacement interferometer system is comprised of the light source 100, the motion object 150, a first displacement interferometer 101, a second displacement interferometer 102, a controller 500, and an optical transfer unit 160. The first and second displacement interferometers, 101 and 102, measure displacements in the first and second directions (i.e., the x- and y-directions, respectively) of the motion object 150, respectively. For this, the first and second displacement interferometers, 101 and 102, utilize a light beam emitted from the light source 100. The first displacement interferometer 101 is composed of a first beam splitter 111, a first reference mirror 141, a first displacement converter 121, and a first detector 131. Preferably, the displacement interferometer shown in FIG. 3C or 4C is used as the first displacement interferometer 101. That is, the first displacement converter 121 is fixed to the motion object 150, while the first beam splitter 111, the first reference mirror 141, and the first detector 131 is spaced a constant distance from the light source 100. The first displacement converter 121 transforms the displacement $\Delta Dx$, which is perpendicular to the progressing direction (i.e., the y-direction) of the first measuring beam 201, into the variation of the path length, $\Delta P1$, of the first measuring beam 201. For this, the optical devices including the diffraction gratings shown in FIGS. 6A and 6B may be used as the first displacement converter 121.

Figure 1:
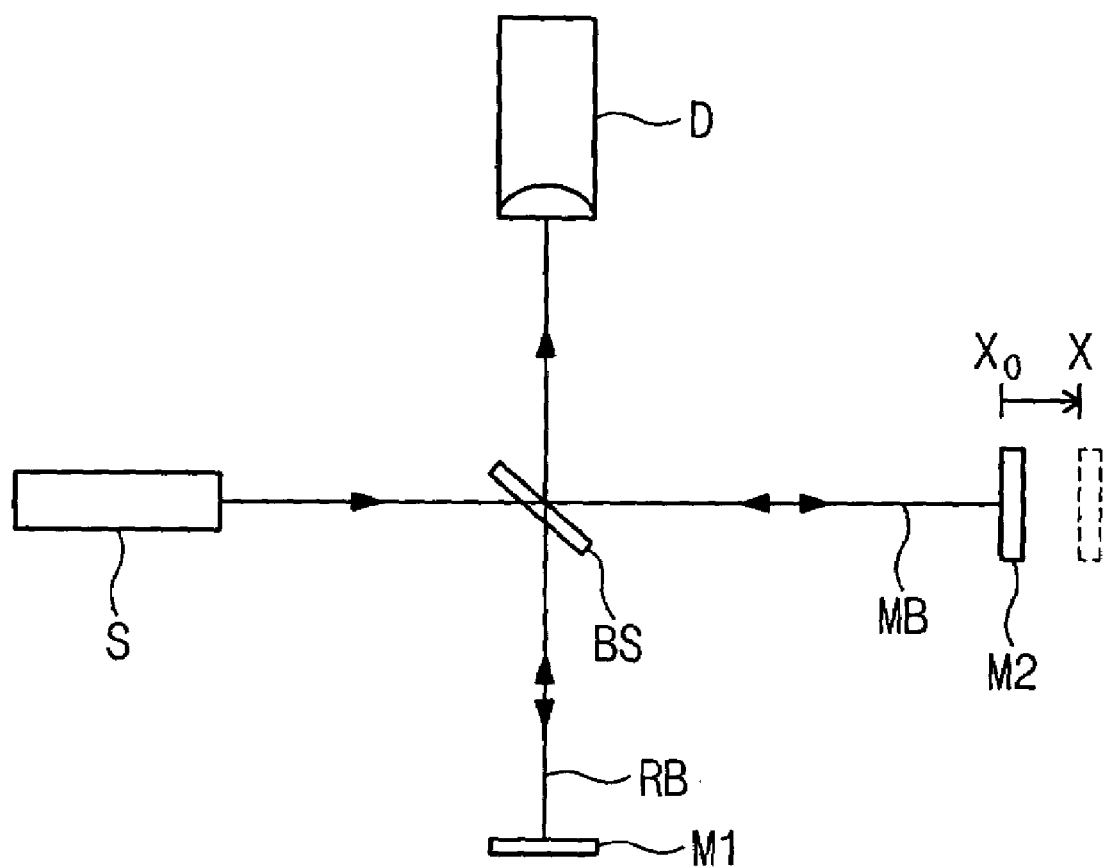
FIG. 1 is a schematic diagram showing a basic structure of a conventional Michelson interferometer.
Figure 2:
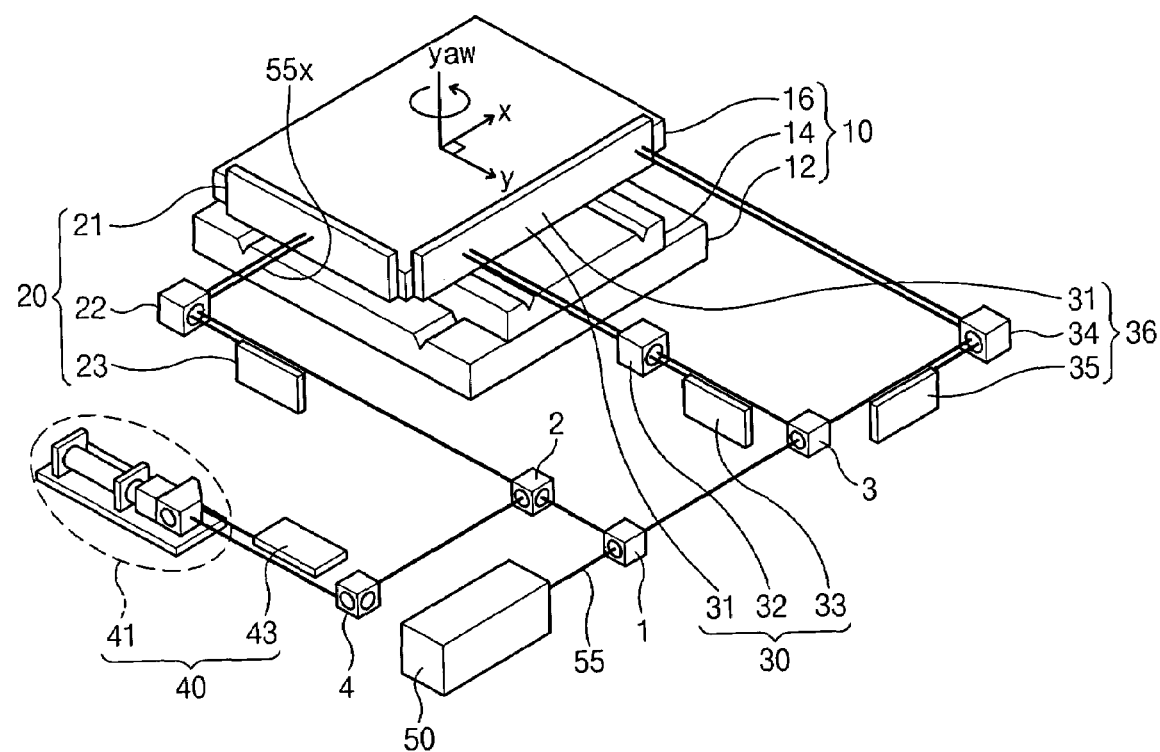
FIG. 2 is a perspective diagram showing a conventional X-Y stage system and a displacement interferometer for determining a position of the stage system.

The second displacement interferometer 102 is composed of a second beam splitter 112, a second reference mirror 142, a second displacement converter 122, and a second detector 132. A light beam is divided into second reference and measuring beams, 212 and 202, by the second beam splitter 112, progressing toward the second reference mirror 142 and the second displacement converter 122, respectively. The second reference mirror 142 and the second displacement converter 122 reflect the second reference beam 212 and the second measuring beam 202, respectively, toward the second beam splitter 112. The second displacement converter 122 transforms a y-directional displacement $\Delta Dy$ of the motion object 150 into the variation of path length, $\Delta P2$, of the second measuring beam 202. The second reference mirror 142 and the second displacement converter 122 are preferably arranged to reflect the second reference beam 212 and the second measuring beam 202 thereon in the opposite directions of their incident directions. For this, the second reference mirror 142 or the second displacement converter 122 may include a plane mirror, a corner tube, an angular reflector, or a retro-reflector. In other words, the second displacement interferometer 102 may be a conventional displacement interferometers (see, e.g., FIG. 1).

The controller 500 calculates displacements of the directions, for the motion object 150, from optical results found by the first and second detectors 131 and 132. Here, the variation of the interference fringe sensed by the second detector 132 results from the y-directional displacement $\Delta Dy$ of the motion object 150. Compared to this, the variation of the interference fringe sensed by the first detector 131, as described in conjunction with FIGS. 3C and 4C, results from the total displacement value $\Delta D\_tot$ that is made by adding the y-directional displacement $\Delta Dy$ to the x-directional displacement $\Delta Dx$ of the motion object 150.

Thus, the controller 500 conducts an operation for subtracting the y-directional displacement $\Delta Dy$, which is obtained from the result sensed by the second detector 132, from the displacement $\Delta D\_tot$ that is obtained from the result sensed by the first detector 131, in order to obtain the x-directional displacement $\Delta Dx$ of the motion object 150.

The optical transfer unit 160 is interposed between the first and second displacement interferometers 101 and 102, transferring a light beam from the light source 100 to the interferometers 101 and 102. According to this embodiment, the optical transfer unit 160 includes a beam splitter 161 for dividing a light beam of the light source 100 into first and second beams that progress toward the first and second beam splitters 111 and 112 respectively, and a reflection mirror 162 for reflecting the first beam to the first beam splitter 111.

Figure 8:
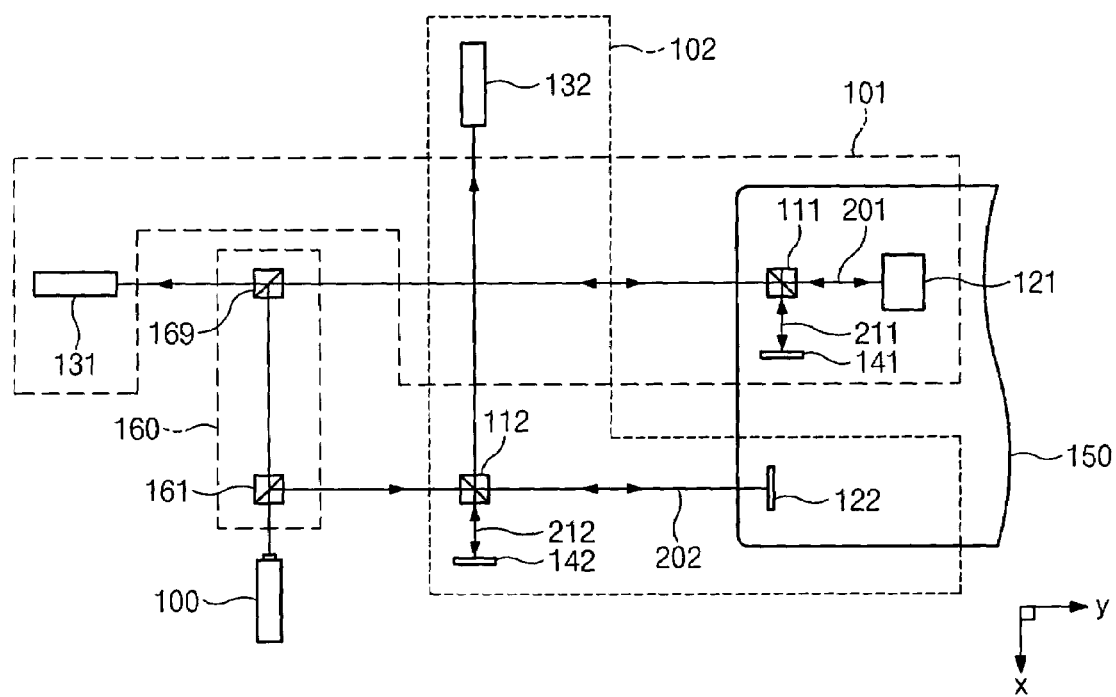

FIG. 8 illustrates an X-Y stage system employing the displacement interferometer according to the present invention. Referring to FIG. 8, the displacement interferometer system according to this embodiment includes the light source 100, the motion object 150, the first displacement interferometer 101, the second displacement interferometer 102, and an optical transfer unit 160. The first and second displacement interferometers, 101 and 102, measure the x- and y-directional displacements, respectively, of the motion object 150, using a light beam emitted from the light source 100.

The first displacement interferometer 101 is composed of the first beam splitter 111, the first reference mirror 141, the first displacement converter 121, and the first detector 131. Preferably, the displacement interferometer shown in FIG. 3B or 4B is used as the first displacement interferometer 101. That is, the first displacement converter 121, the first beam splitter 111, and the first reference mirror 141 are fixed to the motion object 150, while the first detector 131 is spaced a constant distance from the light source 100. The first displacement converter 121 transforms the displacement $\Delta Dx$, which is perpendicular to the progressing direction (i.e., the y-direction) of the first measuring beam 201, into the variation of the path length, $\Delta Px$, of the first measuring beam 201. For this, the optical devices including the diffraction gratings shown in FIGS. 6A and 6B may be used as the first displacement converter 121.

Meanwhile, as the second displacement interferometer 102 and the optical transfer unit 160 aforementioned with reference to FIG. 7 are the same with this embodiment shown in FIG. 8, hereinafter will be described difference therebetween. In this embodiment, the reflection mirror 162 (see FIG. 7) included in the optical transfer unit 160 is preferably substituted with another beam splitter 169 that is shown in FIG. 3B or 4B.

The x- and y-directional displacements of the motion object 150 are independently measured by the first and second displacement interferometers 101 and 102, respectively. The first displacement interferometer 101 for the x-directional displacement uses a diffraction grating and does not need to be equipped with a mirror that is sized in correspondence with the maximum displacement along the y-direction.

Figure 9:
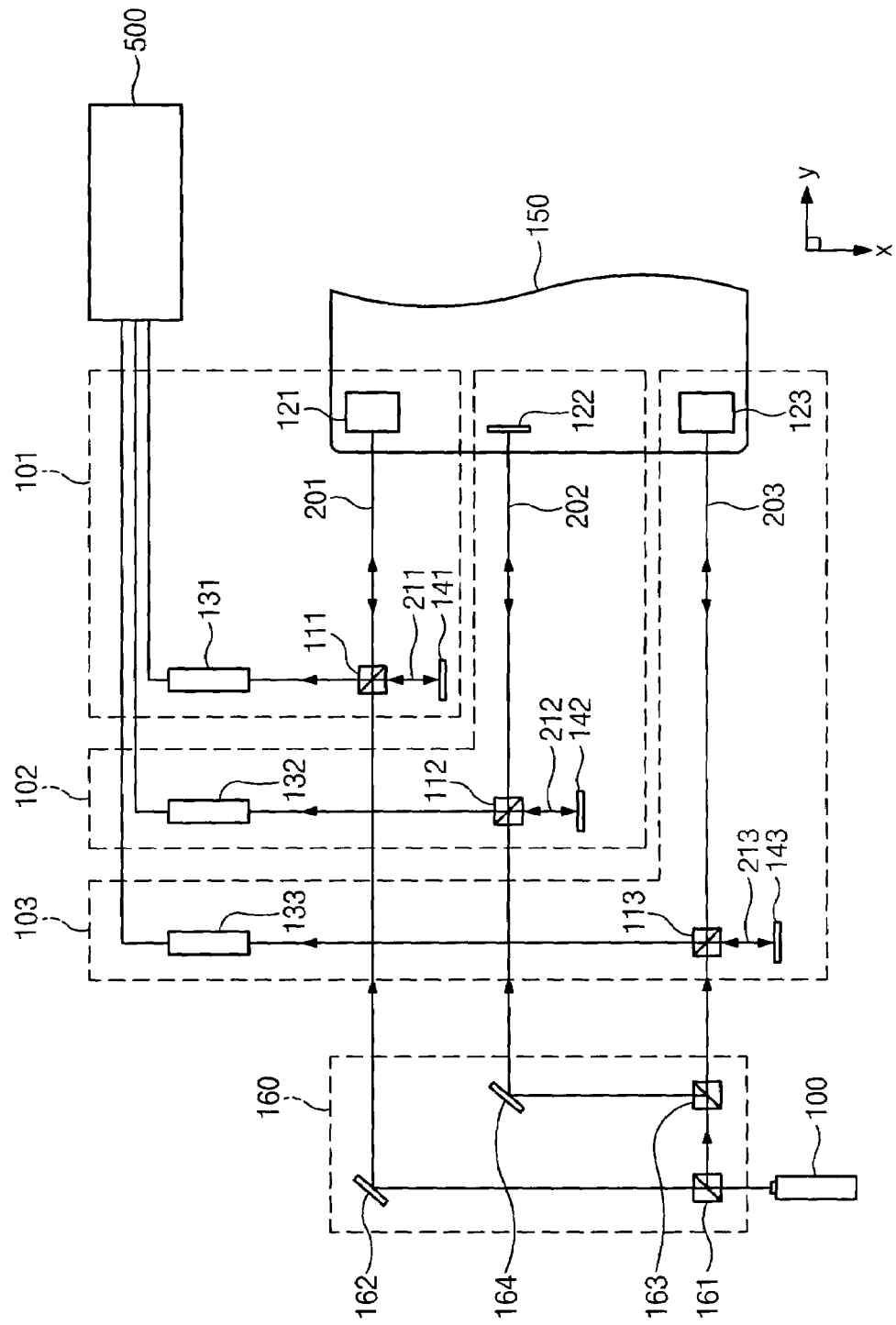

FIG. 9 illustrates a stage position control system having the displacement interferometer in accordance with embodiments of the present invention. Referring to FIG. 9, the displacement interferometer system according to this embodiment is comprised of the light source 100, the motion object 150, the first displacement interferometer 101, the second displacement interferometer 102, a third displacement interferometer 103, the optical transfer unit 160, and the controller 500. Here, the light source 100 and the motion object 150 are the same with those shown in FIG. 3A. The first displacement interferometer 101 may be the same as the displacement interferometer shown in FIG. 3 or 4, (see also, the first displacement interferometer shown in FIG. 7). Thus, the first displacement converter 121 of the first displacement interferometer 101 is fixed to the motion object 150, while the first beam splitter 111, the first reference mirror 141, and the first detector 131 are arranged to be spaced a constant distance from the light source 100. The first displacement converter 121 transforms the displacement ΔDx, which is perpendicular to the progressing direction (i.e., the y-direction) of the first measuring beam 201, into the variation of the path length, ΔP1, of the first measuring beam 201. For this, the optical devices including the diffraction gratings shown in FIGS. 6A and 6B may be used as the first displacement converter 121.

The second displacement interferometer 102 of FIG. 9 may be the same as the second displacement interferometer used in FIG. 7. Accordingly, the second displacement converter 122 transforms the y-directional displacement ΔDy into the variation of path length, ΔP2, of the second measuring beam 202 progressing from the second beam splitter 112 to the second displacement converter 122.

Figure 10A:
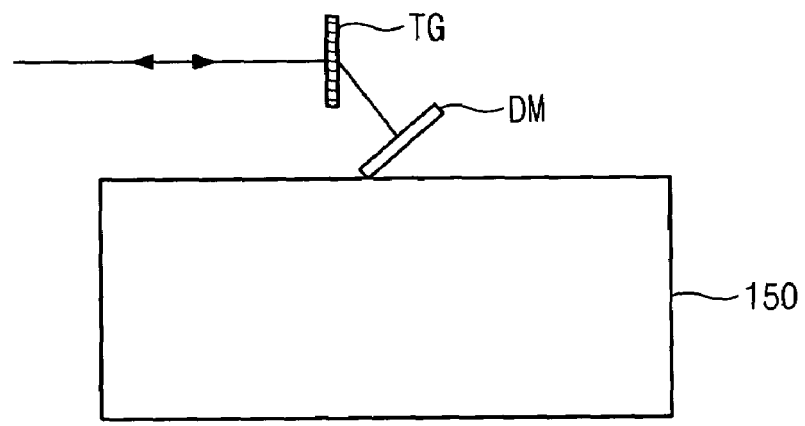
FIGS. 10A and 10B are schematic diagrams illustrating displacement converters of a displacement interferometer system to determine a displacement along the z-direction.
Figure 10B:
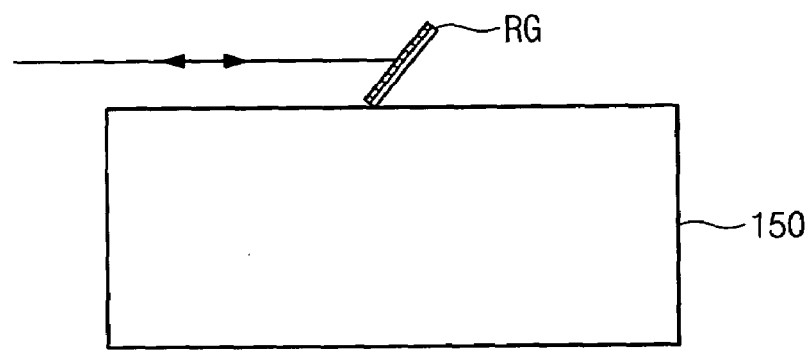

The third displacement interferometer 103 includes a third beam splitter 113, a third reference mirror 143, a third displacement converter 123, and a third detector 133. The third displacement interferometer 103 may be configured with the same structure of the first displacement interferometer 101 shown in FIG. 7. As illustrated in FIG. 10A, if the third displacement converter 123 is constructed of the transmission grating TG and the displacement mirror DM, the third displacement converter 123 is disposed to make a first diffracted beam progress from the transmission grating TG in the angle defined by Equation 5 on the x-y plane. However, as illustrated in FIG. 10B, if the third displacement converter 123 is constructed with the reflection grating RG, the third displacement converter 123 is arranged to enable the first diffracted beam to be diffracted from the reflection grating RG in the opposite to the progressing direction of the third measuring beam 203. In the aforementioned embodiment shown in FIG. 9, the third displacement converter 123 transforms a z-directional displacement ΔDz of the motion object 150 into the variation of path length, ΔP3, of the third measuring beam. The variation of path, ΔP3, of the third measuring beam 203 is utilized to determine the z-directional displacement of the motion object 150. This z-direction is orthogonal to the x and y directions.

On the other hand, the variation of interference fringe sensed by the first and third detectors 131 and 133 contains the influence due to the y-directional displacement of the motion object 150. Therefore, in determining the x- and z-directional displacements, it is necessary, as aforementioned in conjunction with FIG. 7, to subtract the y-directional displacement ΔDy, which is obtained from the result measured by the second detector 132, from the displacement values ΔDx_tot and ΔDz_tot provided by the first and third detectors 131 and 135. This operation of subtracting the y-directional displacement to set the practical x- and z-directional displacements is conducted in the controller 500.

According to another feature of this embodiment, the third displacement interferometer 103 may be constructed in the same structure with the second displacement interferometer 102 shown in FIG. 7. According to this embodiment, both the second and third displacement interferometers, 102 and 103, measure the y-directional displacement of the motion object 150, monitoring yaw of the motion object 150. For this operation, after analyzing the result of measuring, the controller 500 regulating the movement of the motion object 500 is electrically connected to the second and third detectors 132 and 133.

The optical transfer unit 160, which includes the beam splitters 161 and 163, and the reflection mirrors 162 and 164, transfers a light beam from the light source 100 to the first through third displacement interferometers 101, 102, and 103. The disposition and architecture of the optical transfer unit 160 may be modifiable by those skilled in the art. Each displacement interferometer may include a predetermined compensation plane (not shown) that is interposed between the beam splitter and the displacement converter in order to compensate a path difference of the measuring beam for the reference beam.

Figure 11:
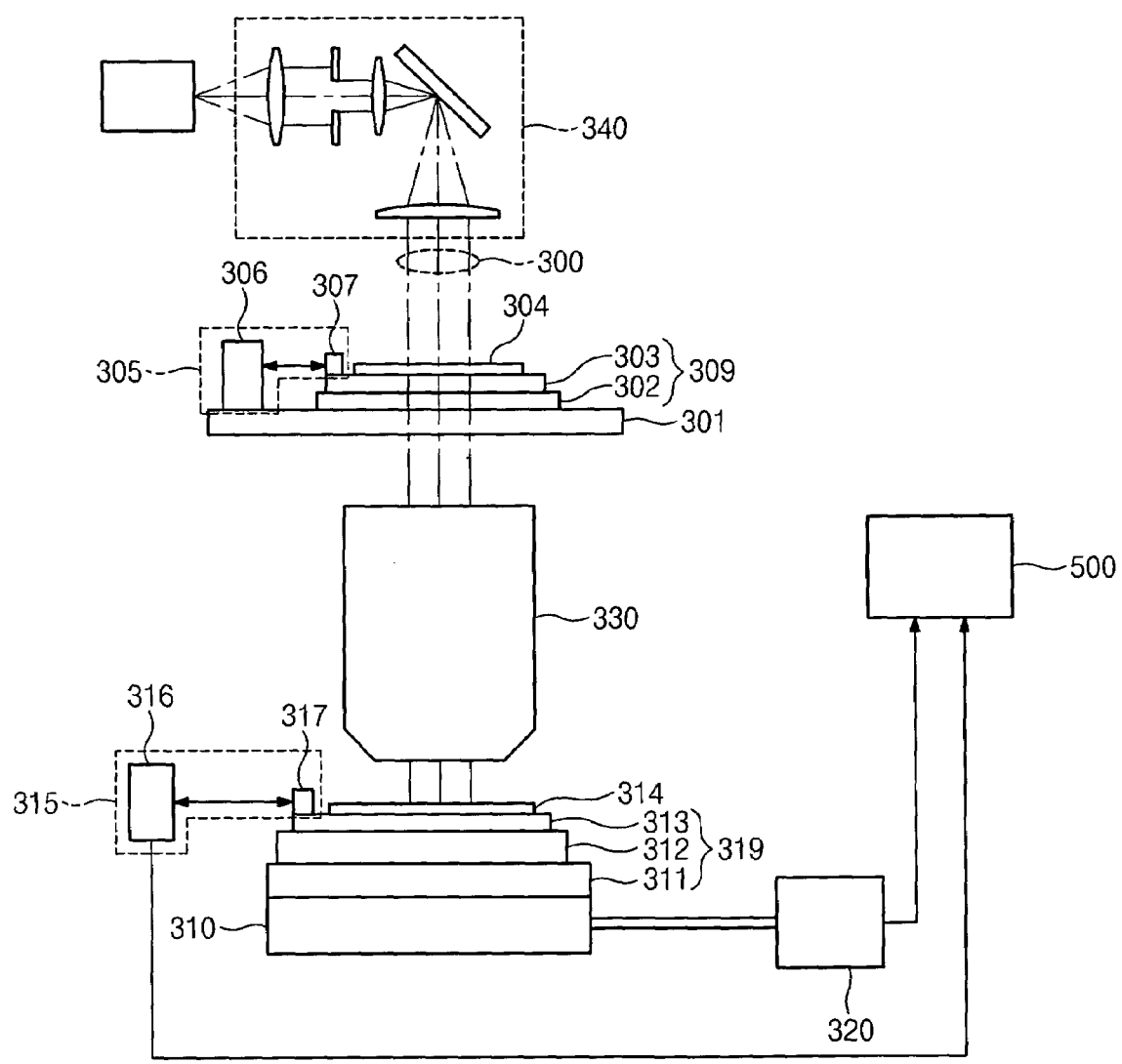
FIG. 11 is a structural diagram illustrating a scan-type exposure system including the displacement interferometer according to the present invention.

FIG. 11 is a structural diagram illustrating a scan-type exposure system, which includes displacement interferometer according to embodiments of the present invention. Referring to FIG. 11, a circuit pattern printed on a reticle 304 is transcribed into a photoresist film formed on a wafer 314 by means of an exposure light 300 incident from an optical illumination unit 340. The circuit pattern may be exposed onto the photoresist film in a scale-down mode. For instance, the circuit pattern transcribed into the photoresist film may be a quarter (¼) of the circuit pattern printed on the reticle 304 in size. The reticle 304 moves with a velocity v in a predetermined direction (e.g., the y-direction) to the exposure light 300, while the wafer 314 moves with a velocity v/m in the opposite of the moving direction (i.e., the direction of −y) of the reticle 304. Here, the parameter m represents a ratio of scale-down exposure.

The reticle 304 is disposed on a higher reticle stage 303 that is mounted on a lower reticle stage 302. The lower reticle stage 302 is positioned on a reticle support 301. The higher and lower reticle stages, 303 and 302, construct a reticle stage system 309. The reticle support 301 is fixed to the system. The lower reticle stage 302 is movable in the y-direction to the reticle support 301, while the higher reticle stage 303 is regulated to be movable within a minute range on the lower reticle stage 302.

On one side of the reticle stage system 309, a plurality of reticle displacement interferometers 305 are disposed to measure a position of the higher reticle stage 303. The information of position about the reticle 304, determined by the reticle displacement interferometer 305, is transferred to the controller 500. The controller 500 regulates an operation of the reticle stage system 309 in order to control the reticle 304 to be properly movable. According to this embodiment, each reticle displacement interferometer 305 includes an optical interference unit 306 and a displacement converter 307. The optical interference unit 306 includes a beam splitter 111, the reference mirror 141, and the detector 131, as shown in FIG. 3A. The displacement converter 307 may be the first displacement converter 121 or the second displacement converter 122 shown in FIG. 7.

Figure 12:
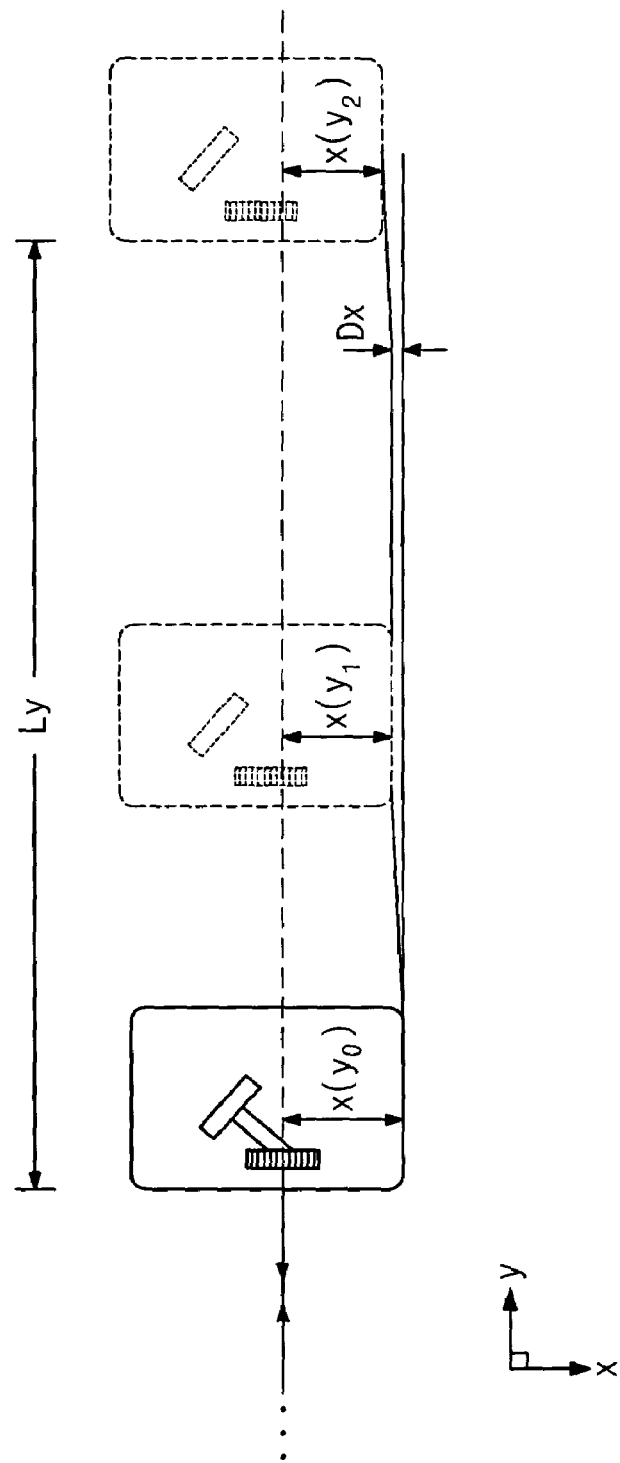
FIG. 12 is a schematic diagram illustrating a displacement along the x-direction, caused from the movement of a reticle along the y-direction.

The scan-type exposure system, the reticle 304 is required to undergo complete linear movement during an exposure process therein. However, as illustrated in FIG. 12, an x-directional position of the reticle 304 may be changed in accordance with a y-directional position while the reticle 304 is moving in the y-direction. In other words, the x-directional displacement ΔDx of the reticle 304 is a function of y-coordinates for the reticle. In this condition, in order to render the reticle 304 in complete linear motion, it is necessary to monitor the x-directional displacement ΔDx of the reticle 304 and then to compensate the difference arising from the monitored result.

One of the reticle displacement interferometers 305 may be installed to monitor the x-directional displacement ΔDx. In this case, the displacement converter 307 is preferably the first displacement converter 121 that transforms the x-directional displacement of the reticle 304 into the path length difference ΔP of the measuring beam progressing along the y-direction.

In the conventional art, a measuring mirror was needed that was larger than the maximum displacement Ly on the moving direction of the reticle 304 in order to construct an interferometer for monitoring the x-directional displacement ΔDx. However, embodiments of the present invention make it possible to monitor the x-directional displacement ΔDx by means of the diffraction grating (and the displacement mirror) sized in correspondence with the maximum displacement perpendicular to the moving direction of the reticle 304. Since the perpendicular displacement ΔDx is much smaller than the maximum displacement Ly in the moving direction, the diffraction grating adaptable to the present invention may be manufactured at lower cost.

With the scaled-down exposure method performed by the scan-type exposure system, the moving distance of the reticle 304 is longer than that of the wafer 314 by the scale-down exposure ratio m. Thus, it is necessary for the measuring mirror of the reticle stage system 309 to be larger than the measuring mirror of the wafer stage system 319 by m times. Considering this condition, as aforementioned, the reticle displacement interferometer 305 preferably employs at least the first displacement converter 121. The displacement converter 121 may include comprise the transmission grating TG and the reflection grating RG, as shown in FIGS. 6A and 6B. Further, the second displacement interferometer 102, which employs the second displacement converter 122 as shown in FIGS. 7 through 9, may be used to monitor the y-directional displacement ΔDy.

The wafer 314 is secured by vacuum to the wafer stage system 319, which includes a first wafer stage 311, a second wafer stage 312, and a third wafer stage 313 those are stacked thereon in sequence. The first wafer stage 311 is movable along the y-direction against the wafer support 310, while the second wafer stage 312 is movable along the x-direction against the wafer support 310. The third wafer stage 313 is movable and rotational along and the z-direction against the wafer support 310.

On one side of the wafer stage system 319, a plurality of wafer stage interferometers 315 are arranged to a position of the third wafer stage 313. Each wafer stage interferometer 315 includes an optical interference unit 316 and a displacement converter 317. The optical interference unit 316 is constructed of the beam splitter 111, the reference mirror 141, and the detector 131, as illustrated in FIG. 3A. The displacement converter 317 may be the first displacement converter 121 or the second displacement converter 122, shown in FIG. 7. According to this embodiment, the displacement converter 317 is preferably the second displacement converter 122.

The information on position of the wafer 314, determined by the wafer stage interferometer 315, is transferred to the controller 500. And, the wafer stage system 319 is connected to a wafer driver 320, which is regulated by the controller 500. In addition, between the reticle stage system 309 and the wafer stage system 319, a lens system 330 is disposed to transmit the exposure light 300, which contains the circuit pattern information printed on the reticle 304, to the wafer 314.

According to these embodiments, there is provided a displacement interferometer having a displacement converter that employs a diffraction grating. The displacement converter transforms the displacement ΔDx, which is perpendicular to the progressing direction (e.g., the y-direction) of the measuring beam, into the path difference ΔP of the measuring beam by means of the diffraction grating. Here, it is proper for the diffraction grating to be sized in correspondence with the maximum displacement of a target object on the x-direction. Thus, it is possible to measure displacements of target objects without requiring a large mirror as is typical in the prior art.

Moreover, because the diffraction mirror does not need to be large size, it is easier to retain uniform optical characteristics. Thus, it is possible to prevent degradation in the accuracy of measuring due to a reduction in the surface uniformity on the measuring mirror. Specifically, because it may be necessary for the reticle stage of the scan-type exposure system to be operable in a fine linear rounding motion, if the displacement interferometer using the diffraction grating as the displacement converter is employed in a position control system of the reticle stage, an improvement in the accuracy of measuring and for the reduction in the costs of manufacturing, maintaining, and repairing the scan-type exposure system should be achieved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A displacement interferometer, comprising:
a beam splitter configured to divide an incoming beam of light into a reference beam of light and a measuring beam of light; and
a displacement converter responsive to the measuring beam of light, said displacement converter configured to transform movement thereof in a direction orthogonal to a first light path of the measuring beam of light into a change in path length between a reflective surface of said displacement converter and the measuring beam of light and further configured to redirect the measuring beam of light back to said beam splitter as a redirected measuring beam of light that travels in an opposite direction along the first light path relative to the measuring beam of light; and
wherein said displacement converter comprises:
a transmission grating having a front surface disposed in a path of the measuring beam of light; and
a displacement mirror facing a rear surface of said transmission grating.

2. The interferometer of claim 1, further comprising:
a reference mirror configured to redirect the reference beam of light back to said beam splitter as the redirected reference beam of light.

3. The interferometer of claim 2, further comprising a detector configured to receive the redirected reference beam of light and the redirected measuring beam of light.

4. The interferometer of claim 1, wherein said displacement mirror faces the rear surface of said transmission grating at an angle β; wherein the change in path length is ΔP; and wherein a movement ΔD of said displacement converter in the direction orthogonal to the measuring beam of light is related to the change in path length ΔP by the following relationship:

ΔP=2ΔD SiN β.

5. A displacement interferometer system comprising:
a light source generating a light beam;
a motion object movable to the light source;
a first displacement interferometer using the light beam to measure a first directional displacement of the motion object; and
a second displacement interferometer using the light beam to measure a second directional displacement of the motion object;
wherein the first displacement interferometer comprises a first displacement converter transforming the first directional displacement of the motion object into a path difference of a light beam incident on the first displacement interferometer along the second direction.

6. The displacement interferometer system as set forth in claim 5, wherein the first displacement interferometer comprises:
a first beam splitter dividing the light beam into a first reference beam and a first measuring beam that progresses to the second direction;
a first reference mirror altering a progressing direction of the first reference beam;
the first displacement converter altering a progressing direction of the first measuring beam; and
a first detector sensing the first reference and measuring beams that are altered in direction,
wherein the first displacement converter transforms the first directional displacement (ΔD1) of the motion object into a path difference (ΔP1) of the first measuring beam.

7. The displacement interferometer system as set forth in claim 6, wherein the second displacement interferometer comprises:
a second beam splitter dividing the light beam into a second reference beam and a second measuring beam that progresses to the second direction;
a second reference mirror altering a progressing direction of the second reference beam;
a second displacement converter altering a progressing direction of the second measuring beam; and
a second detector sensing the second reference and measuring beams that are altered in direction,
wherein the second directional displacement of the motion object is a half of variation in a path length of the second measuring beam.

8. The displacement interferometer system as set forth in claim 6, wherein the first beam splitter, the first reference mirror, and the first displacement converter are fixed to the motion object, moving together with the motion object.

9. The displacement interferometer system as set forth in claim 6, wherein the first beam splitter, the first detector, and the first reference mirror are disposed at positions constantly spaced from the light source, while the first displacement converter is fixed to the motion object to be movable together with the motion object.

10. The displacement interferometer system as set forth in claim 7, wherein the second beam splitter, the second detector, and the second reference mirror are disposed at positions constantly spaced from the light source, while the second displacement converter is fixed to the motion object to be movable together with the motion object.

11. The displacement interferometer system as set forth in claim 6, wherein the first displacement converter comprises:
a transmission grating; and
a displacement mirror disposed apart from the transmission grating, facing the transmission grating with a first slope angle (β1),
wherein the transmission grating and the displacement mirror are disposed to establish a relation of ΔP1=2·ΔD1·sin β1 among the path difference (ΔP1) of the first measuring beam, the first slope angle (β1), and the first directional displacement (ΔD1).

12. The displacement interferometer system as set forth in claim 11, wherein the transmission grating is arranged perpendicular to the progressing direction of the first measuring beam.

13. The displacement interferometer system as set forth in claim 11, wherein when a pitch of grating fringes composing the transmission grating is d; an angle in which the progressing direction of the measuring beam is relative to a normal of the transmission grating is α; and a wavelength of the light beam is λ, the first slope angle β1 of the displacement mirror is arcsin(λ/d−sin α) against the normal of the transmission grating.

14. The displacement interferometer system as set forth in claim 6, wherein the first displacement converter comprises a reflection grating disposed with a first slope angle (β1) to the progressing direction of the first measuring beam,
wherein the reflection grating is disposed to establish a relation of ΔP1=2·ΔD1·tan β1 among the path difference (ΔP1) of the first measuring beam, the first slope angle (β1), and the first directional displacement (ΔD1).

15. The displacement interferometer system as set forth in claim 14, wherein when a pitch of grating fringes composing the reflection grating is d; and a wavelength of the light beam is λ, the slope angle β of the reflection grating is arcsin (λ/d) against the progressing direction of the measuring beam.

16. The displacement interferometer system as set forth in claim 5, wherein the light beam is one of a mono-frequency laser, a dual-frequency laser, a multi-frequency laser, Lamb laser, Zeeman laser, inverted Lamb laser, and a spectral light beam.

17. The displacement interferometer system as set forth in claim 5, wherein the first direction is perpendicular to the second direction.

18. The displacement interferometer system as set forth in claim 5, which further comprises a third displacement interferometer uses the light beam to measure a third directional displacement of the motion object,
wherein the first displacement interferometer comprises:
a third beam splitter dividing the light beam into a third reference beam and a third measuring beam that progresses to the second direction;
a third reference mirror altering a progressing direction of the third reference beam;
a third displacement converter altering a progressing direction of the third measuring beam; and
a third detector sensing the third reference and measuring beams that are altered in direction,
wherein the third displacement converter transforms the third directional displacement (ΔD3) of the motion object into a path difference (ΔP3) of the third measuring beam.

19. The displacement interferometer system as set forth in claim 18, wherein the third beam splitter, the third reference mirror, and the third displacement converter are fixed to the motion object, moving together with the motion object.

20. The displacement interferometer system as set forth in claim 18, wherein the third beam splitter, the third detector, and the third reference mirror are disposed at positions constantly spaced from the light source, while the third displacement converter is fixed to the motion object to be movable together with the motion object.

21. The displacement interferometer system as set forth in claim 18, wherein the third displacement converter comprises:
   a transmission grating; and
   a displacement mirror disposed apart from the transmission grating, facing the transmission grating with a second slope angle ($\beta 2$),
   wherein the transmission grating and the displacement mirror are disposed to establish a relation of $\Delta P3=2\cdot\Delta D3\cdot\sin\beta 2$ among the path difference ($\Delta P3$) of the third measuring beam, the second slope angle ($\beta 2$), and the third directional displacement ($\Delta D3$).

22. The displacement interferometer system as set forth in claim 21, wherein when a pitch of grating fringes composing the transmission grating is d; an angle in which the progressing direction of the measuring beam is relative to a normal of the transmission grating is $\alpha$; and a wavelength of the light beam is $\lambda$, the second slope angle $\beta 2$ of the displacement mirror is $\arcsin(\lambda/d-\sin\alpha)$ against the normal of the transmission grating.

23. The displacement interferometer system as set forth in claim 21, wherein the transmission grating is arranged perpendicular to the progressing direction of the third measuring beam.

24. The displacement interferometer system as set forth in claim 18, wherein the third displacement converter comprises a reflection grating disposed with a second slope angle ($\beta 2$) to the progressing direction of the third measuring beam,
   wherein the reflection grating is disposed to establish a relation of $\Delta P3=2\cdot\Delta D3\cdot\tan\beta 2$ among the path difference ($\Delta P3$) of the third measuring beam, the second slope angle ($\beta 2$), and the third directional displacement ($\Delta D3$).

25. The displacement interferometer system as set forth in claim 24, wherein when a pitch of grating fringes composing the reflection grating is d;
   and a wavelength of the light beam is $\lambda$, the second slope angle $\beta 2$ of the reflection grating is $\arcsin(\lambda/d)$ against the progressing direction of the measuring beam.

26. A scan-type exposure system comprising:
   a light source generating a light beam;
   a reticle stage movable along a y-direction to the light source;
   a first displacement interferometer using the light beam to measure an x-directional displacement of the reticle stage; and
   a second displacement interferometer using the light beam to measure a y-directional displacement of the reticle stage;
   wherein the first displacement interferometer comprises a first displacement converter transforming the x-directional displacement of the reticle stage into a path difference of a light beam incident on the first displacement interferometer along the y-direction.

27. The scan-type exposure system as set forth in claim 26, wherein the first displacement interferometer comprises:
   a first beam splitter dividing the light beam into a first measuring beam progressing along the x-direction and a first reference beam progressing along the y-direction;
   a first reference mirror altering a progressing direction of the first reference beam;
   a first displacement converter altering a progressing direction of the first measuring beam; and
   a first detector sensing the first reference and measuring beams that are altered in direction,
   wherein the first displacement converter transforms the x-directional displacement ($\Delta Dx$) of the reticle stage into a path difference ($\Delta P$) of the first measuring beam.

28. The scan-type exposure system as set forth in claim 27, wherein the second displacement interferometer comprises:
   a second beam splitter dividing the light beam into a second measuring beam progressing along the x-direction and a second reference beam progressing along the y-direction;
   a second reference mirror altering a progressing direction of the second reference beam;
   a second measuring mirror altering a progressing direction of the second measuring beam; and
   a second detector sensing the second reference and measuring beams that are altered in direction,
   wherein the second directional displacement of the reticle stage is a half of variation in a path length of the second measuring beam.

29. The scan-type exposure system as set forth in claim 27, wherein the first beam splitter, the first reference mirror, and the first displacement converter are fixed to the reticle stage, moving together with the reticle stage.

30. The scan-type exposure system as set forth in claim 27, wherein the first beam splitter, the first detector, and the first reference mirror are disposed at positions constantly spaced from the light source, while the first displacement converter is fixed to the reticle stage to be movable together with the reticle stage.

31. The scan-type exposure system as set forth in claim 28, wherein the second beam splitter, the second detector, and the second reference mirror are disposed at positions constantly spaced from the light source, while the second measuring mirror is fixed to the reticle stage to be movable together with the reticle stage.

32. The scan-type exposure system as set forth in claim 27, wherein the first displacement converter comprises:
   a transmission grating; and
   a displacement mirror disposed apart from the transmission grating, facing the transmission grating with a slope angle ($\beta$),
   wherein the transmission grating and the displacement mirror are disposed to establish a relation of $\Delta P=2\cdot\Delta Dx\cdot\sin\beta$ among the path difference ($\Delta P$) of the first measuring beam, the slope angle ($\beta$), and the x-directional displacement ($\Delta Dx$).

33. The scan-type exposure system as set forth in claim 32, wherein when a pitch of grating fringes composing the transmission grating is d; an angle in which the progressing direction of the measuring beam is relative to a normal of the transmission grating is $\alpha$; and a wavelength of the light beam is $\lambda$, the slope angle $\beta$ of the displacement mirror is $\arcsin(\lambda/d-\sin\alpha)$ against the normal of the transmission grating.

34. The scan-type exposure system as set forth in claim 32, wherein the transmission grating is arranged perpendicular to the progressing direction of the first measuring beam.

35. The scan-type exposure system as set forth in claim 27, wherein the first displacement converter comprises a reflection grating disposed with a slope angle ($\beta$) to the progressing direction of the first measuring beam,
   wherein the reflection grating is disposed to establish a relation of $\Delta P=2\cdot\Delta dx\cdot\tan\beta$ among the path difference ($\Delta P$) of the first measuring beam, the slope angle ($\beta$), and the x-directional displacement ($\Delta Dx$).

36. The scan-type exposure system as set forth in claim 35, wherein when a pitch of grating fringes composing the reflection grating is d; and a wavelength of the light beam is λ, the slope angle β of the reflection grating is arcsin (λ/d) against the progressing direction of the measuring beam.

37. The scan-type exposure system as set forth in claim 26, wherein the light beam is one of a mono-frequency laser, a dual-frequency laser, a multi-frequency laser, Lamb laser, Zeeman laser, inverted Lamb laser, and a spectral light beam.

38. The scan-type exposure system as set forth in claim 26, which further comprises:
- a lens system disposed under the reticle stage;
- a wafer stage disposed under the lens stage; and
- a light source generating exposure light transmitting the reticle stage and the lens system.

39. A displacement interferometer system comprising:
- a light source generating a light beam;
- a motion object movable to the light source;
- a first displacement interferometer including a first beam splitter dividing the light beam into a first reference beam and a first measuring beam progressing along a second direction, a first reference mirror altering a progressing direction of the first reference beam, the first displacement converter altering a progressing direction of the first measuring beam and transforming a first directional displacement (ΔD1) of the motion object into a path difference (ΔP1) of the first measuring beam, and a first detector sensing the first reference and measuring beams that are altered in direction;
- a second displacement interferometer including a second beam splitter dividing the light beam into a second reference beam and a second measuring beam that progresses to the second direction, a second reference mirror altering a progressing direction of the second reference beam, a second displacement converter altering a progressing direction of the second measuring beam, and a second detector sensing the second reference and measuring beams that are altered in direction; and
- a controller obtaining the first and second directional displacements of the motion object from results by the first and second displacement interferometers, wherein the first beam splitter, the first detector, and the first reference mirror are disposed at positions constantly spaced from the light source, while the first displacement converter is fixed to the motion object; and
- wherein the controller determines a practical value of the first directional displacement by subtracting a displacement, which is calculated with a result of the second displacement interferometer, from a displacement that is calculated with a result of the first displacement interferometer.

40. The displacement interferometer system as set forth in claim 39, wherein the second beam splitter, the second detector, and the second reference mirror are disposed at positions constantly spaced from the light source, while the second displacement converter is fixed to the motion object to be movable together with the motion object.

41. The displacement interferometer system as set forth in claim 39, wherein the first displacement converter comprises:
- a transmission grating; and
- a displacement mirror disposed apart from the transmission grating, facing the transmission grating with a slope angle (β),
  wherein the transmission grating and the displacement mirror are disposed to establish a relation of ΔP=2·ΔD1·sin β among the path difference (ΔP) of the first measuring beam, the slope angle (β), and the first directional displacement (ΔD1).

42. The displacement interferometer system as set forth in claim 41, wherein the transmission grating is arranged perpendicular to the progressing direction of the first measuring beam.

43. The displacement interferometer system as set forth in claim 41, wherein when a pitch of grating fringes composing the transmission grating is d; an angle in which the progressing direction of the measuring beam is relative to a normal of the transmission grating is α; and a wavelength of the light beam is λ, the slope angle β of the displacement mirror is arcsin(λ/d−sin α) against the normal of the transmission grating.

44. The displacement interferometer system as set forth in claim 39, wherein the first displacement converter comprises a reflection grating disposed with a slope angle (β1) to the progressing direction of the first measuring beam,
wherein the reflection grating is disposed to establish a relation of ΔP=2·ΔD1·tan β among the path difference (ΔP) of the first measuring beam, the slope angle (β), and the first directional displacement (ΔD1) of the motion object.

45. The displacement interferometer system as set forth in claim 44, wherein when a pitch of grating fringes composing the reflection grating is d; and a wavelength of the light beam is λ, the slope angle β of the reflection grating is arcsin(λ/d) against the progressing direction of the measuring beam.

46. The displacement interferometer system as set forth in claim 39, wherein the first direction is perpendicular to the second direction.

* * * * *